(12) United States Patent
Webb

(10) Patent No.: US 8,754,500 B2
(45) Date of Patent: Jun. 17, 2014

(54) PLATED LAMINATION STRUCTURES FOR INTEGRATED MAGNETIC DEVICES

(75) Inventor: Bucknell C. Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/597,412

(22) Filed: Aug. 29, 2012

(65) Prior Publication Data

US 2014/0061853 A1 Mar. 6, 2014

(51) Int. Cl.
*H01L 27/08* (2006.01)
(52) U.S. Cl.
USPC .......................................... 257/531; 336/200
(58) Field of Classification Search
USPC .......................................... 257/531; 336/200
See application file for complete search history.

(56) References Cited

U.S. PATENT DOCUMENTS

| | | | | |
|---|---|---|---|---|
| 4,640,871 | A | * | 2/1987 | Hayashi et al. ............... 428/611 |
| 4,959,631 | A | * | 9/1990 | Hasegawa et al. ............ 336/83 |
| 5,479,695 | A | * | 1/1996 | Grader et al. ................. 29/602.1 |
| 5,847,634 | A | * | 12/1998 | Korenivski et al. ........... 336/200 |
| 7,636,242 | B2 | | 12/2009 | Hazucha et al. |
| 7,710,234 | B2 | | 5/2010 | Gardner et al. |
| 7,719,084 | B2 | | 5/2010 | Gardner et al. |
| 7,733,204 | B2 | | 6/2010 | Hahn et al. |
| 7,755,124 | B2 | | 7/2010 | Fajardo et al. |
| 2003/0080845 | A1 | * | 5/2003 | Fontanella et al. ........... 336/200 |
| 2008/0157910 | A1 | * | 7/2008 | Park et al. .................... 336/110 |
| 2013/0176095 | A1 | * | 7/2013 | Fontana et al. ............... 336/199 |

FOREIGN PATENT DOCUMENTS

JP 5-234021 * 9/1993

* cited by examiner

*Primary Examiner* — A. Sefer
(74) *Attorney, Agent, or Firm* — Louis J. Percello; Ryan, Mason & Lewis, LLP

(57) ABSTRACT

Semiconductor integrated magnetic devices such as inductors, transformers, etc., having laminated magnetic-insulator stack structures are provided, wherein the laminated magnetic-insulator stack structures are formed using electroplating techniques. For example, an integrated laminated magnetic device includes a multilayer stack structure having alternating magnetic and insulating layers formed on a substrate, wherein each magnetic layer in the multilayer stack structure is separated from another magnetic layer in the multilayer stack structure by an insulating layer, and a local shorting structure to electrically connect each magnetic layer in the multilayer stack structure to an underlying magnetic layer in the multilayer stack structure to facilitate electroplating of the magnetic layers using an underlying conductive layer (magnetic or seed layer) in the stack as an electrical cathode/anode for each electroplated magnetic layer in the stack structure.

6 Claims, 8 Drawing Sheets

100

200

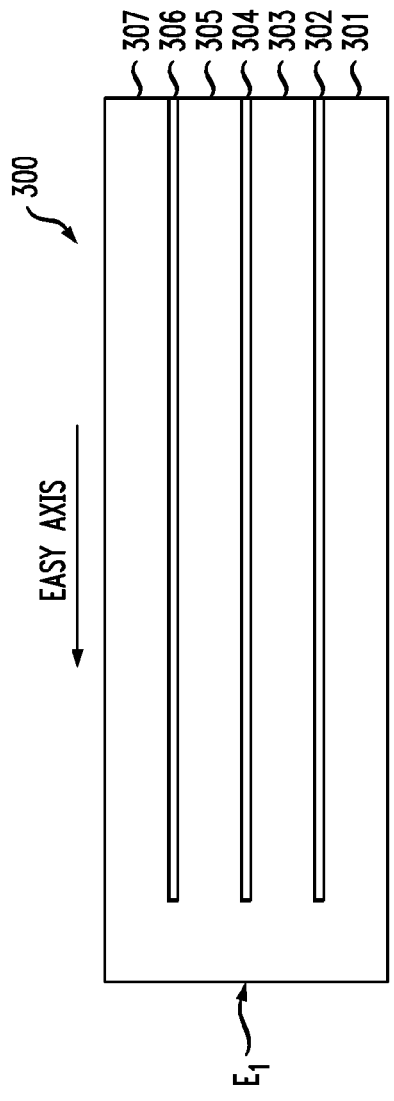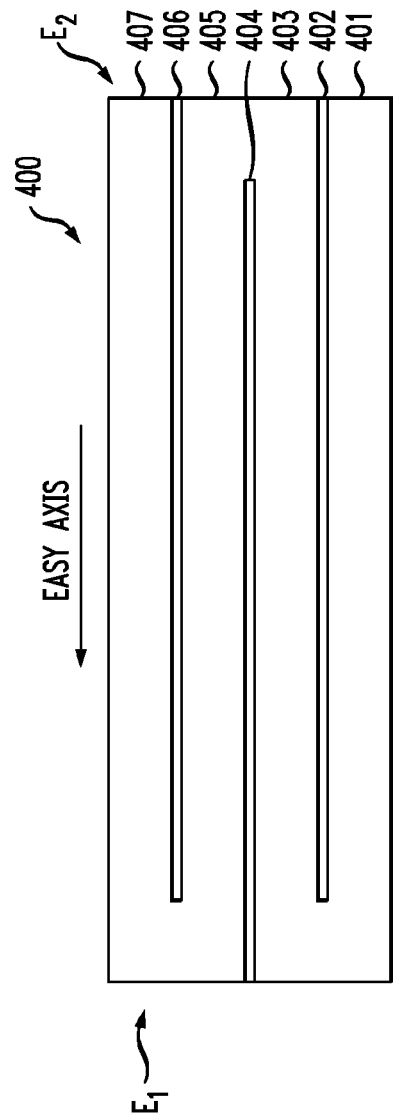

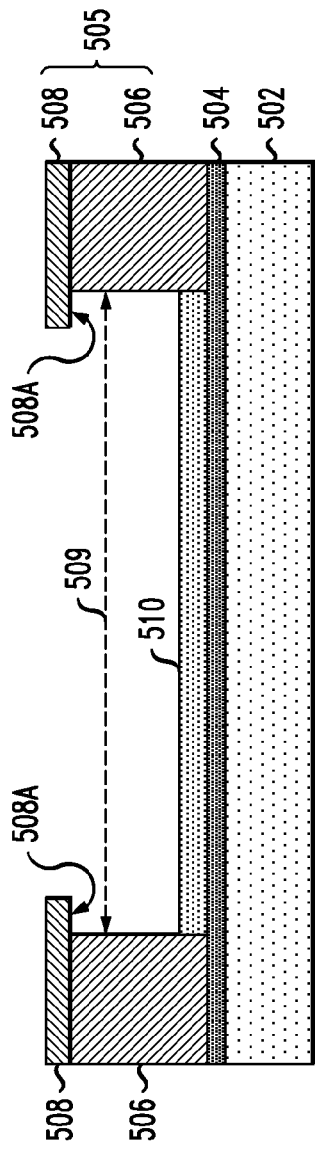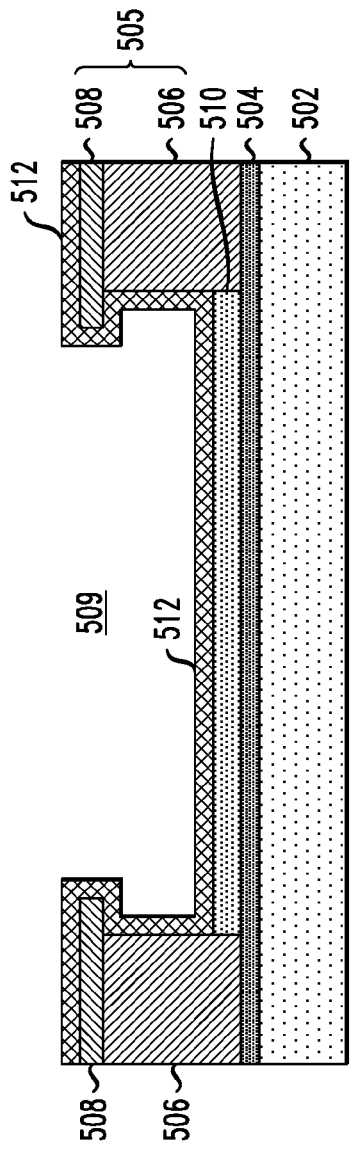

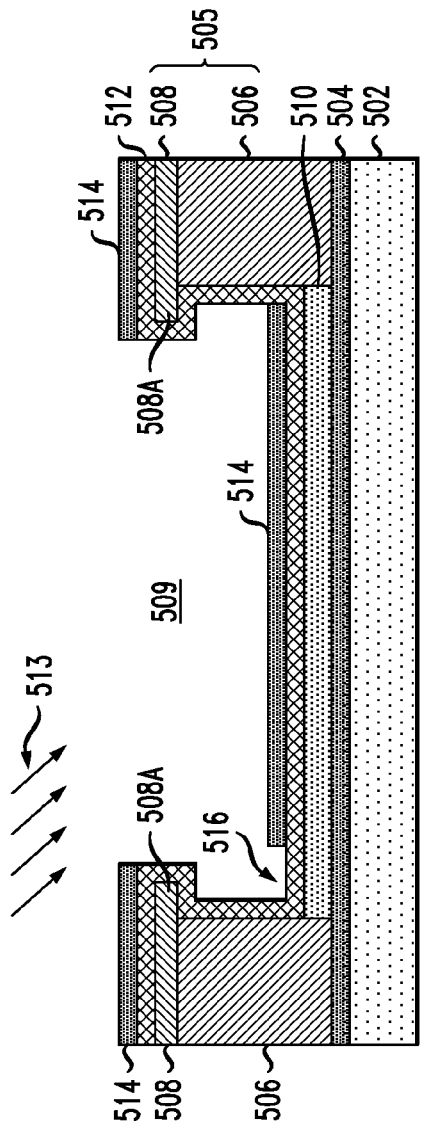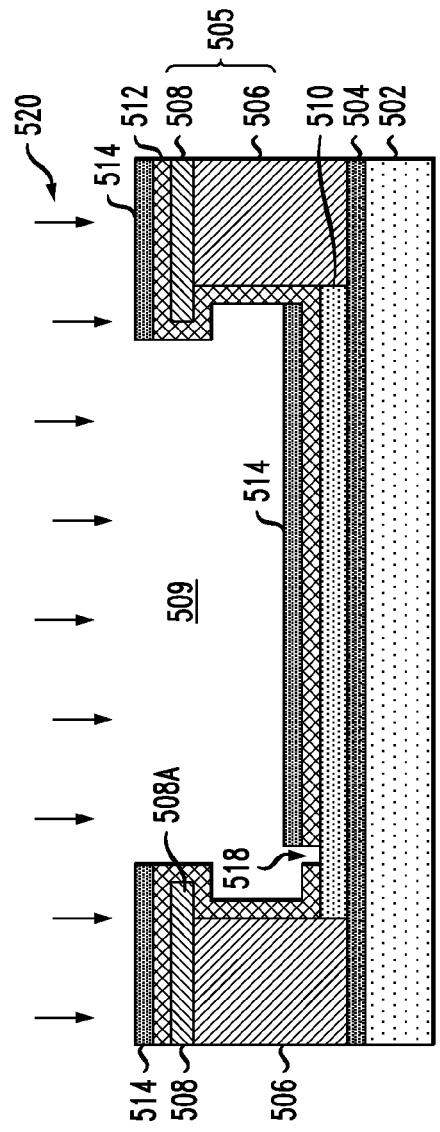

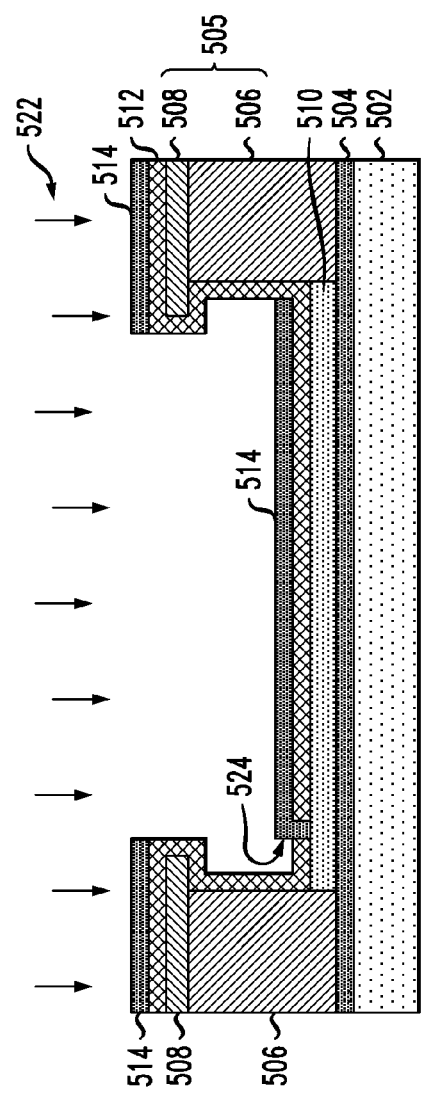
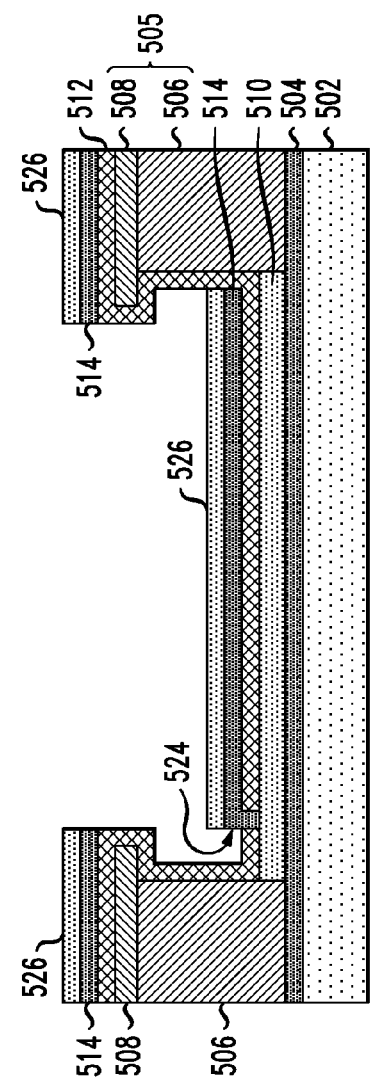
FIG. 5E
500
FIG. 5F
500

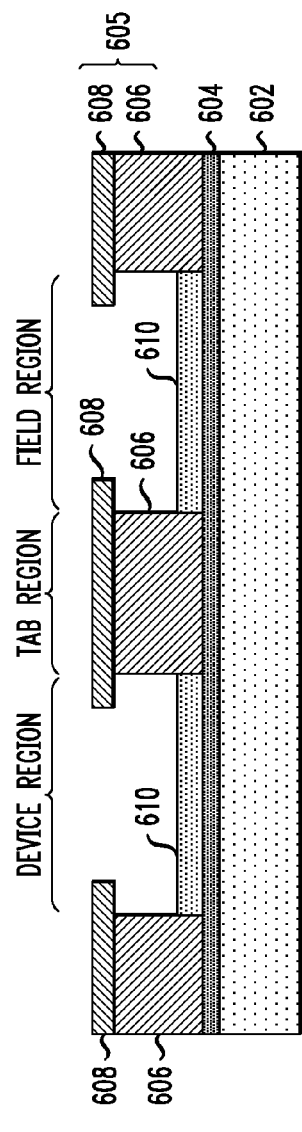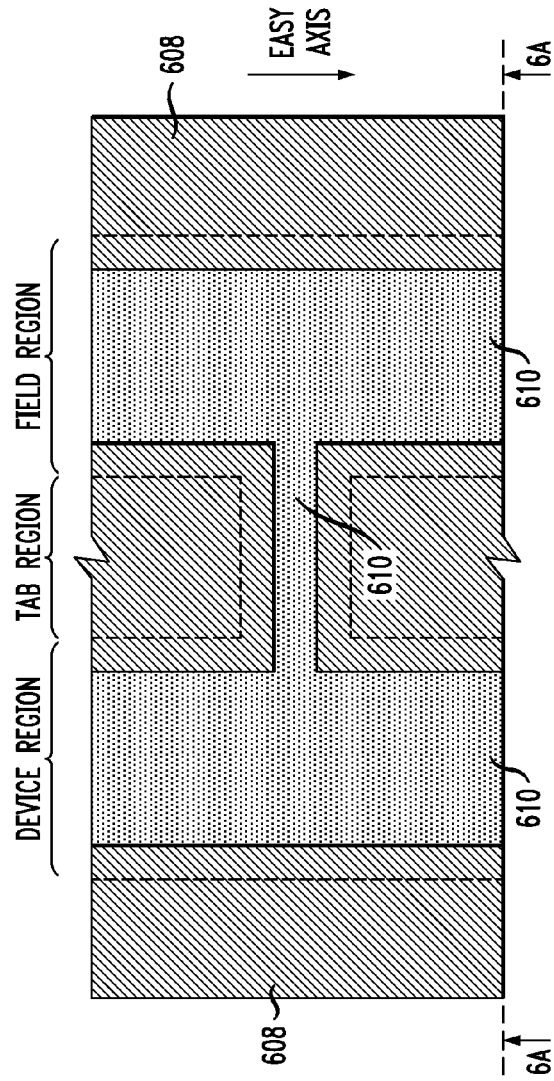
FIG. 6A
600
FIG. 6B
600

600

600

PLATED LAMINATION STRUCTURES FOR INTEGRATED MAGNETIC DEVICES

STATEMENT REGARDING FEDERALLY SPONSORED RESEARCH OR DEVELOPMENT

This invention was made with Government support under Contract No. DE-EE0002892 awarded by the Department of Energy. The Government has certain rights in this invention.

TECHNICAL FIELD

The field relates generally to semiconductor integrated magnetic devices such as inductors, transformers, etc., having laminated magnetic-insulator stack structures that are formed using electroplating techniques.

BACKGROUND

When constructing a semiconductor integrated magnetic device using a magnetic film, it is desirable to make the magnetic film sufficiently thick to obtain desirable operating characteristics for a given frequency of operation. However, the thickness of a single magnetic layer that is required for a given operating frequency of the magnetic device may result in the build-up of eddy currents in the magnetic material during operation, thereby resulting in some loss. As such, the magnetic film is typically made sufficiently thin to avoid eddy current losses, but with the tradeoff of lower energy storage ability.

The energy storage of an integrated magnetic device can be increased, however, by building a magnetic structure using a stack of alternating thin magnetic and insulating films, wherein the magnetic layers are separated by a thin insulating layer. In general, the use of multiple layers of magnetic material separated by layers of insulating material serves to prevent the build-up of eddy currents in the magnetic material, while providing an effective thickness of magnetic material, which is sufficient to obtain the desired operating characteristics for a given frequency of operation.

Conventional techniques for building multilayer magnetic-insulator structures include sputtering techniques. In general, a sputtering process includes forming a multilayer stack by alternately sputtering layers of a magnetic material and a dielectric material, patterning a photoresist layer to form an etch mask, using the etch mask to etch the multilayer stack of magnetic-insulating layers and remove unwanted regions of the multilayer stack, and then removing the etch mask. While sputtering can be used to build stacks of magnetic-insulating layers, the material and manufacturing costs for sputtering are high.

SUMMARY OF THE INVENTION

Exemplary embodiments of the invention generally include semiconductor integrated magnetic devices such as inductors, transformers, etc., having laminated magnetic-insulator stack structures that are formed using electroplating techniques.

For example, in one exemplary embodiment of the invention, an integrated laminated magnetic device includes a multilayer stack structure having alternating magnetic and insulating layers formed on a substrate, wherein each magnetic layer in the multilayer stack structure is separated from another magnetic layer in the multilayer stack structure by an insulating layer. A local shorting structure electrically connects each magnetic layer in the multilayer stack structure to an underlying magnetic layer in the multilayer stack structure to facilitate electroplating of the magnetic layers using an underlying conductive layer (magnetic layer or seed layer) in the stack as an electrical cathode/anode for each electroplated magnetic layer in the stack structure. The local shorting structure preferably provides an electrical connection between two magnetic layers such that no closed electrical path exists between the two magnetic layers except in a direction parallel to a flux path of the multilayer stack structure.

In another exemplary embodiment of the invention, a method for fabricating an integrated laminated magnetic device includes forming a first seed layer on a substrate and forming a mask structure over the first seed layer, wherein the mask structure exposes a portion of the first seed layer that defines a device region. A first magnetic layer is electroplated on the exposed portion of the first seed layer within the device region using the first seed layer as an electrical cathode or anode. A first insulating layer is formed on the first magnetic layer in the device region. A second seed layer is formed on the first insulating layer in the device region. An opening is formed in the first insulating layer down to the first magnetic layer in the device region. A first conductive plug is formed in the opening of the first insulating layer, wherein the first conductive plug electrically connects the second seed layer to the first magnetic layer. A second magnetic layer is electroplated on the exposed portion of the second seed layer within the device region using the first seed layer as an electrical cathode or anode, wherein the first seed layer is electrically connected to the second seed layer through the first magnetic layer and the first conductive plug.

In yet another exemplary embodiment of the invention, a method for fabricating an integrated laminated magnetic device includes forming a first seed layer on a substrate and foaming a mask structure over the first seed layer, wherein the mask structure exposes portions of the first seed layer, which define a device region, a tab region, and a field region. A first magnetic layer is electroplated on the exposed portion of the first seed layer within the device region, tab region and field region, using the first seed layer as an electrical cathode or anode. A first insulating layer is formed on the first magnetic layer in the device region. A second seed layer is formed on the first insulating layer in the device region and on the first magnetic layer in the tab region and field region, wherein the second seed layer is completely isolated from the first magnetic layer in the device region by the first insulating layer. A second magnetic layer is electroplated on the exposed portion of the second seed layer within the device region using the first seed layer as an electrical cathode or anode, wherein the first seed layer is electrically connected to the second seed layer through the first magnetic layer in the tab and field regions.

These and other exemplary embodiments of the present invention will become apparent from the following detailed description of illustrative embodiments thereof, which is to be read in connection with the accompanying drawings.

BRIEF DESCRIPTION OF THE DRAWINGS

FIG. 3 schematically illustrates a method for implementing local shorting of magnetic layers along one edge of a magnetic stack structure according to an exemplary embodiment of the invention.

FIG. 4 schematically illustrates a method for implementing local shorting of magnetic layers along two opposing edges of a magnetic stack structure according to another exemplary embodiment of the invention.

FIGS. 5A, 5B, 5C, 5D, 5E, and 5F schematically illustrate a method for constructing a magnetic structure with local shorting of magnetic layers, according to an exemplary embodiment of the invention, wherein:

FIG. 5A is a cross-sectional view of the magnetic structure at an initial stage of fabrication wherein a first magnetic layer is plated on seed layer formed over a semiconductor substrate, FIG. 5B is a cross-sectional view of the structure of FIG. 5A after forming a conformal insulating layer over the first magnetic layer, FIG. 5C is a cross sectional view of the structure of FIG. 5B after forming a second seed layer, FIG. 5D is a cross sectional view of the structure of FIG. 5C after etching an opening (e.g., trench) in the first insulting layer down to the first magnetic layer within a device region, FIG. 5E is a cross sectional view of the structure of FIG. 5D after depositing additional seed material to fill the opening with conductive seed material, thereby forming an electrical connection between the second seed layer and the underlying first magnetic layer and first seed layer within the device region, and FIG. 5F is a cross sectional view of the structure of FIG. 5E after forming a second magnetic layer using an electroplating process.

FIGS. 6A, 6B, 6C, 6D, 6E, and 6F schematically illustrate a method for constructing a magnetic structure with local shorting of magnetic layers, according to another exemplary embodiment of the invention, wherein:

FIG. 6A is a cross-sectional view of the magnetic structure at an initial stage of fabrication taken along line 6A-6A in FIG. 6B, wherein a first magnetic layer is plated on a first seed layer formed over a semiconductor substrate, FIG. 6B is a top schematic view of the magnetic structure of FIG. 6A, FIG. 6C is a cross-sectional view of the structure of FIG. 6A after forming a conformal insulating layer (or first insulating layer) over the substrate, wherein FIG. 6C is a view taken along line 6C-6C in FIG. 6D, FIG. 6D is a top schematic view of the magnetic structure of FIG. 6C, FIG. 6E is a cross sectional view of the structure of FIG. 6C after forming a second seed layer, and FIG. 6F is a cross sectional view of the structure of FIG. 6E after forming a second magnetic layer using an electroplating process.

DETAILED DESCRIPTION OF EXEMPLARY EMBODIMENTS

Figure 1:
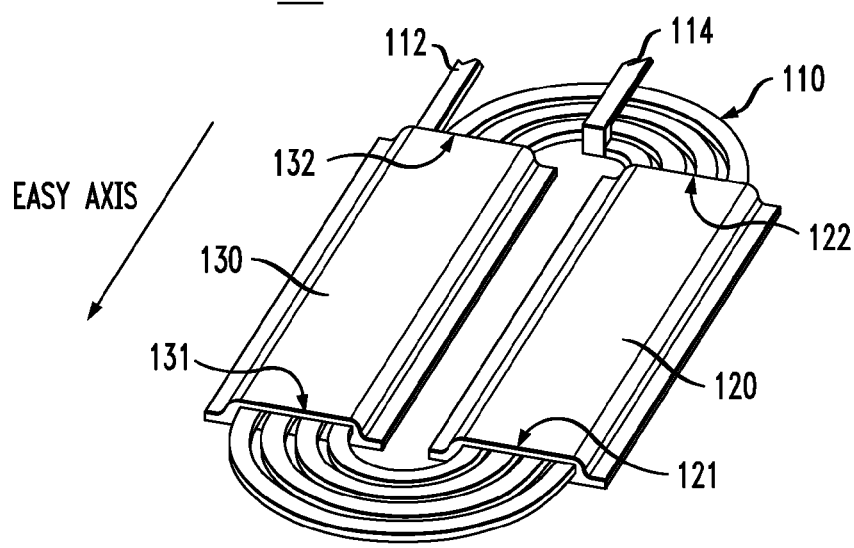
FIG. 1 is a schematic perspective view of a semiconductor integrated magnetic device having a multilayer magnetic stack structure formed with local shorting, according to an exemplary embodiment of the invention.

Exemplary embodiments of the invention will now be described in further detail with regard to semiconductor integrated magnetic devices such as inductors, transformers, etc., having laminated magnetic-insulator stack structures that are formed using electroplating techniques.

With standard electroplating techniques, each magnetic layer in a multilayer stack of magnetic-insulating layers can be formed as follows. A first step involves depositing a conducting seed layer over the entire wafer via a vapor deposition process. Next, a layer of photoresist material is deposited and etched to form a photoresist mask that covers portions of the seed layer where plating of magnetic material is unwanted. Next, an electrical connection is made to the seed layer and an electroplating process is performed to electroplate a layer of magnetic material onto the portions of the seed layer that are exposed through the photoresist mask. After the electroplating process is performed, the photoresist mask is removed and the residual seed layer (portions of seed layer that were covered by the photoresist mask) is removed by RIE or some other suitable etching process. Thereafter, an insulating layer is formed over the electroplated magnetic layer. The electroplating process is then repeated for each additional layer of magnetic material that is deposited to form the multilayer stack of magnetic-insulating layers.

In particular, after each insulating layer is formed, the process steps of seed layer deposition, resist and mask alignment, resist patterning, electroplating, resist strip, and seed layer removal, are independently performed for each layer of the magnetic stack structure. This process repetition can be expensive and cumbersome when the number of magnetic layers forming a stack is large. Moreover, this process can also cause alignment problems between the magnetic layers.

In accordance with exemplary embodiments of the invention, an electroplating process is simplified by eliminating the repeated steps of depositing and patterning a photoresist pattern, removing the photoresist pattern and etching away the seed layer, for each layer of magnetic/insulating material. In general, an electroplating process according to embodiments of the invention involves using only one patterning mask, and then sequentially forming the magnetic layers and subsequent seed layers with a local electrical connection (short) between the seed/magnetic layers in the stack so the intervening insulating layers do not electrically isolate the seed/magnetic layer in the stack. By electrically shorting the seed/magnetic layers in the stack, each new layer of seed and magnetic material can be plated using the local short connection down to the underlying layers, e.g., down to the first (bottom) seed layer, for example, which is formed to the edge of the wafer, wherein the electrical connection is made with contact to the first (bottom) seed layer around the rim of the wafer. As explained below, the local shorting between the magnetic laminations in the stack is made such that there are no closed electrical paths involving two magnetic layers except in directions parallel to a flux path of the multilayer magnetic structure.

Figure 2:
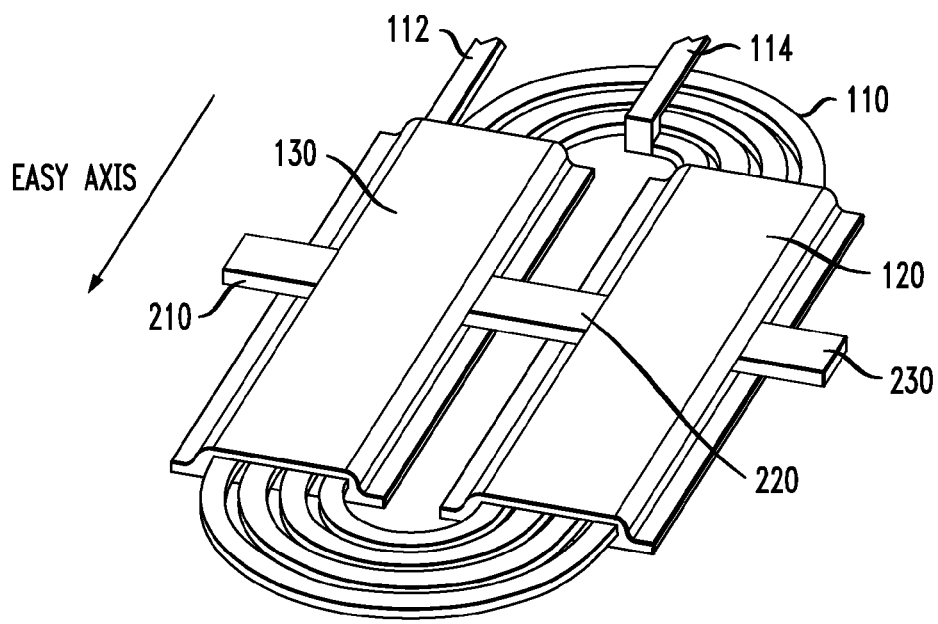
FIG. 2 is a schematic perspective view of a semiconductor integrated magnetic device having a multilayer magnetic stack structure formed with local shorting, according to another exemplary embodiment of the invention.

Various techniques may be used to construct multilayer magnetic structures with local shorting between the seed/magnetic layers to facilitate electroplating. FIGS. 1 and 2 illustrate integrated magnetic devices having multilayer magnetic stacks with local shorting, according to exemplary embodiments of the invention. As explained below, FIG. 1 illustrates an integrated magnetic device having multilayer magnetic stacks with local shorting of magnetic layers along the edges of the magnetic stacks, and FIG. 2 illustrates an integrated magnetic device having multilayer magnetic stacks with local shorting of magnetic layers using narrow tabs that extend from the stack of magnetic layers in a direction perpendicular to an easy axis of the device.

In particular, FIG. 1 is a schematic perspective view of a semiconductor integrated magnetic device 100 having multilayer magnetic stack structures formed with local shorting, according to an exemplary embodiment of the invention. The integrated magnetic device 100 shown in FIG. 1 is a semiconductor integrated planar inductor device that comprises a planar multi-turn coil structure 110 having an input port 112 and an output port 114. The integrated magnetic device 100 further comprises a plurality of magnetic structures 120 and 130 that surround portions of the coil structure 110 along the "easy axis" of the integrated magnetic device 100. Each magnetic structure 120 and 130 is multilayer structure comprising a plurality of sequentially formed layers of magnetic and insulating materials. In particular, the magnetic structures 120 and 130 each comprise a lower stack structure that is formed on the substrate below the coil structure 110 and an upper stack structure that is formed above the coil structure 110. The lower and upper stack structures of the magnetic structures 120 and 130 serve to completely enclose the portions of the coil structure 110 along the easy axis region of the integrated device 100, thereby forming a closed loop of magnetic material that carries the magnetic flux fields generated by current flowing through the coil structure 110 and to increase the storable energy density of the device 100.

In some embodiments of the invention, the magnetic layers of each of the lower and upper stack portions of the magnetic structure 120 are locally shorted to each other along an edge 121 or 122 or both edges 121 and 122 to enable formation of the magnetic structure 120 using electroplating techniques as described herein. Similarly, the magnetic layers of each of the lower and upper stack portions of the magnetic structure 130 are locally shorted to each other along an edge 131 or 132 or both edges 131 and 132 to enable formation of the magnetic structure 130 using electroplating techniques as described herein.

FIGS. 3 and 4 schematically illustrate techniques for employing local shorting of magnetic layers at the edges of a magnetic structure according to exemplary embodiments of the invention. More specifically, FIG. 3 is a schematic side view of a magnetic structure 300 comprising a plurality of magnetic layers 301, 303, 305 and 307 separated by insulating layers 302, 304 and 306. The magnetic layers 301, 303, 305 and 307 are connected (shorted) to each other along an edge E1 of the magnetic structure 300. FIG. 4 is a schematic side view of a magnetic structure 400 comprising a plurality of magnetic layers 401, 403, 405 and 407 separated by insulating layers 402, 404 and 406. The magnetic layers 401, 403, 405 and 407 are connected (shorted) to each other by a local shorting between magnetic layers 401 and 403 along edge E1 of the magnetic structure 300, a local shorting between magnetic layers 403 and 405 along edge E2 and by a local shorting between layers 405 and 407 along edge E1.

In an exemplary embodiment of the invention, the magnetic structures 300 and 400 of FIGS. 3 and 4 illustrate techniques for locally shorting the magnetic layers within the lower portions and the upper portions of the magnetic structures 120 and 130 in FIG. 1. Various methods for forming magnetic stack structures with local shorting between magnetic layers as shown in FIGS. 3 and 4 will be discussed in further detail with reference to FIGS. 5A, 5B, 5C, 5D, 5E and 5F, according to exemplary embodiments of the invention.

FIG. 2 is a schematic perspective view of a semiconductor integrated magnetic device 200 having multilayer magnetic stack structures formed with local shorting, according to an exemplary embodiment of the invention. The integrated magnetic device 200 shown in FIG. 2 is similar to the integrated magnetic device 100 of FIG. 1 except for the addition of a plurality of shorting tabs 210, 220 and 230, which serve to provide local shorting of the magnetic layers forming the magnetic structures 120 and 130. The shorting tabs are formed in a direction perpendicular to an easy axis of the device to avoid formation of current loops in the magnetic structures 120 and 130. Various methods for forming magnetic stack structures using shorting tabs to provide local shorting between magnetic layers, such as shown in FIG. 2, will be discussed in further detail with reference to FIGS. 6A, 6B, 6C, 6D, 6E, and 6F, according to exemplary embodiments of the invention.

Various methods for constructing a magnetic structure such as shown in FIGS. 3 and 4 will now be discussed in further detail with reference to FIGS. 5A, 5B, 5C, 5D, 5E, and 5F, a method for constructing a magnetic structure with local shorting of magnetic layers along one or more edges thereof, according to an exemplary embodiment of the invention. In particular, FIGS. 5A, 5B, 5C, 5D, 5E, and 5F are cross-sectional views of a magnetic structure 500 at various stages of fabrication. FIG. 5A is a cross-sectional view of the magnetic structure 500 at an initial stage of fabrication wherein a first magnetic layer 510 is plated on seed layer 504 formed over a semiconductor substrate 502, wherein the magnetic layer 510 is defined by a mask structure 505. The semiconductor substrate 502 can be a silicon substrate, an SIO (silicon on insulator) substrate, or the substrate 502 can be formed with any other type of semiconductor substrate material, or multiple layers of substrate materials, as commonly used in VLSI device fabrication.

The seed layer 504 is an electrically conducting layer that is conformally deposited on the entire surface of the substrate 502 to provide a base layer for a subsequent plating process to form the first magnetic layer 510 on the seed layer 504 (and other magnetic layers, as discussed below). The seed layer 504 may be formed using any suitable material, including metallic materials such as copper, or magnetic materials such as NiFE, CoFE, or other known materials, that are commonly used as a seed layers that serve as a cathode for an electroplating process to grow a layer of magnetic material thereon. The conformal seed layer 504 may be deposited by PVD (physical vapor deposition), CVD (chemical vapor deposition), or ALD (atomic layer deposition) methods, or other methods that are suitable for the material used for the seed layer 504. Optionally, small amounts of organic material can be added to the first conformal seed layer 504 to increase the plating rate. Adding the organic material allows differential-rate plating, super-filling, super-conformal, or bottom-up plating.

After forming the seed layer 504 on the substrate 502, a next step in the exemplary fabrication process comprises forming the first magnetic layer 510 on the seed layer 504 (via electroplating) using the mask pattern 505. In particular, with this process, the mask structure 505 is initially formed to define an opening 509 (or "device region") that exposes a portion of the seed layer 504 on which magnetic material will be electroplated to form the first magnetic layer 510, and to form a lip portion 508A (or overhang portion) that is used for shadow deposition and etching techniques as discussed in further detail below. The mask structure 505 can be formed in various ways.

For instance, the mask structure 505 can be formed by sequentially depositing a first photoresist layer 506 (made of a first photoresist material) and a second photoresist layer 508 (made of a second photoresist material) and exposing and developing the photoresist layers 506 and 508 in a manner to form the mask structure 505 having the defined opening 509 and a lip portion 508A (or overhang portion). With this process, the first photoresist layer 506 can be formed of a material that is more sensitive to the exposure light than the material forming the second photoresist layer 508. In this regard, the different layers 506 and 508 at a transition region (i.e., the edge of a patterning mask formed on top of the photoresist layer 508 which defines opening 509) would be affected differently by exposure of UV light (through the patterning mask that defines the opening 509) such that the portion of the photoresist layer 508 near the transition region would not be as sensitive to UV light exposure and, thus, resulting in formation of the lip portion 508A when both photoresist layers 506 and 508 are developed.

In other embodiments, the mask structure 505 can be formed by depositing a single layer of photoresist material, and exposing and developing the photoresist layer in such a way as to form the mask structure 505 having the defined opening 509 and lip portion 508A. For example, the two layers 506 and 508 shown in FIG. 5A can actually be formed from a single layer of photoresist material, which is exposed to UV light, and then developed using a suitable etching chemical that would etch the material of the exposed photoresist layer differently at the surface of the photoresist layer than at levels in the exposed photoresist layer that are below the surface.

After forming the mask structure 505, an electroplating process is performed to grow the first magnetic layer 510 on the surface of the first conformal seed layer 504 that is exposed by the opening 509 of the mask structure 505. The first magnetic layer 510 may be formed by electroplating materials such as permalloy or magnetic alloys of Co, Fe, Ni, of CoFeTa, other suitable magnetic materials known in the art. In the electroplating process, an electrical connection is made to the seed layer 504 at the edge (rim) of the wafer substrate 502 to serve as an electrode (e.g., cathode or anode) for the electroplating process, as is understood by those of ordinary skill in the art.

After forming the first magnetic layer 510, a first layer of insulating material is conformally deposited over the structure of FIG. 5A to cover the first magnetic layer 510 and mask structure 505. For example, FIG. 5B is a cross-sectional view of the structure of FIG. 5A after forming a conformal insulating layer 512 over the substrate lining the mask structure 505 and the first magnetic layer 512. The conformal insulating layer 512 serves to isolate the first magnetic layer 510 from a second layer of magnetic material to be subsequently formed on a second conformal seed layer. The first conformal insulating layer 512 may be formed with any suitable insulating material, such as silicon dioxide, silicon nitride, aluminum oxide, polymers such as polyimide, PBO (poly (p-phenylene benzoxazole)) and other insulating or dielectric materials, which are commonly used for VLSI device fabrication and deposited using known techniques. The insulating layer may be deposited using known deposition techniques such as PVD, CVD, or ALD methods. The first conformal insulating layer 512 may comprise one or multiple layers of materials, serving as a barrier layer, adhesion layer and/or an insulating liner, as is readily understood by those of ordinary skill in the art. For instance, and adhesion or liner layer may comprise a Tantalum Nitride/Tantalum (TaN/Ta) or a Titanium Nitride/Titanium bi-layer, and other suitable materials, which may be conformally deposited/grown using methods such as PVD, CVD, or ALD.

A next step in the exemplary process involves forming a seed layer over the structure of FIG. 5B. FIG. 5C is a cross sectional view of the structure of FIG. 5B after forming a second seed layer 514. As shown in FIG. 5C, the second seed layer 514 is formed covering the horizontal surfaces of the mask structure 505 and the portion of the insulating layer 510 over the first magnetic layer 510. In one embodiment, the second seed layer 514 is formed using a metallic material such as copper or a magnetic material using evaporation or sputtering methods. A seed layer deposition process 513 is performed at a slight angle so that a small gap 516 (or void) is formed, where seed material is not deposited on a portion of the insulating layer 514 within the device region 509. With the angled deposition process 513, the lip portion 508A of the mask structure 505 located above the gap region 516 prevents (via shadowing) the deposition of seed material on that region of the first insulating layer 514 under the lip portion 508A, while the angled deposition allows the seed material to be formed on regions of the insulating layer 514 under the other lip portions 508A which do not block (via shadowing) the seed layer deposition. The small gap 516 allows an opening or trench to be etched in the insulating layer 514 down to the first magnetic layer 510.

In particular, FIG. 5D is a cross sectional view of the structure of FIG. 5C after etching an opening 518 (e.g., trench) in the first insulting layer 514 down to the first magnetic layer 510 within the device region 509 defined by the mask structure 505. In one embodiment, the opening 518 is formed using an anisotropic dry etch process (e.g. RIE process) to etch the first insulating layer 512 using the second seed layer 514 and overhanging lip portion 508A as an etch mask. A next step in the exemplary process is to deposit additional seed material over the structure of FIG. 5D to fill the opening 518 and form an electrical connection between the second seed layer and the underlying magnetic and seed layers.

More specifically, FIG. 5E is a cross sectional view of the structure of FIG. 5D after depositing additional seed material to fill the opening 518 with conductive seed material, thereby forming an electrical connection between the second seed layer 514 and the underlying magnetic layer 510 and seed layer 504. In one embodiment, a seed deposition process 522 is performed to deposit a metallic or magnetic material over the structure of FIG. 5D and form a conductive plug 524 that fills the opening 518 and connects the seed layer 514 with the underlying magnetic and seed layers. In this process, additional seed material is formed on top of the second seed layer 514. The additional seed material can the same material used to form the second seed layer 514, or the additional seed material can be different from the material used to form the second seed layer 514.

After forming the conductive plug 524, another electroplating process is performed to form a magnetic layer on the seed layer 514. FIG. 5F is a cross sectional view of the structure of FIG. 5E after forming a second magnetic layer 526 using an electroplating process. In this process, the portion of the second seed layer 514 formed within the opening 509 of the mask structure 404 is electrically connected to the underlying first seed layer 504 through the conductive plug 524 and first magnetic layer 510. As such, the electroplating process can be performed to plate the second layer of magnetic material 526 on that portion of the second seed layer 514 formed within the device region 509 defined by the mask structure 504 by making electrical contact to the underlying first seed layer 504 at the edge of the wafer substrate 502. The second magnetic layer 526 may be formed using any suitable material as discussed above for the first magnetic layer 510.

After forming the second magnetic layer 526, the process steps discussed with reference to FIGS. 5B, 5C, 5D, 5E and 5F can be repeated to form another insulting layer, seed layer, and magnetic layer over the second magnetic layer 526. In particular, the process steps discussed above with reference to FIG. 5B can be used to form a second conformal insulating layer over the substrate lining the mask structure 505 and the second magnetic layer 526. The process steps discussed above with reference to FIG. 5C can be used to form a third seed layer covering the horizontal surfaces of the mask structure 505 and the second insulating layer over the third magnetic layer in the device region 509. Moreover, the process steps discussed above with reference to FIG. 5D can be used to etch an opening in the second insulting layer down to the second magnetic layer 525 within the device region 509. Further, the process steps discussed above with reference to FIG. 5E can be used to fill the opening in the second insulating layer with conductive seed material, thereby forming a second conductive plug that provides an electrical connection between the third seed layer and the underlying second magnetic layer 526, second seed layer 514, first magnetic layer 510 and first seed layer 504. Then, using process steps discussed above with reference to FIG. 5F, another electroplating process can be performed to form a third magnetic layer on the third seed layer by making electrical contact to the first seed layer 504 at the edge (rim) of the wafer substrate. Thereafter, the sequence of process steps discussed with reference to FIGS. 5B, 5C, 5D, 5E and 5F can be repeated one or more times, as desired, to form one or more additional insulating and magnetic layers of the magnetic stack structure within the device region 509.

In some embodiments, such as shown in FIG. 5F, portions of the second seed layer 514 and the second magnetic layer 526 (and subsequent seed and magnetic layers) can be formed on the mask structure 505 and other regions of the substrate surface outside the device region 509. In general, when forming magnetic devices, it is preferable to deposit magnetic films in the presence of a magnetic field (e.g., magnet in electroplating tank) to impart a magnetic orientation in the magnetic films to form the "easy axis", as is understood by those of ordinary skill in the art. By plating the second magnetic film 526 (and subsequent magnetic films) over the entire wafer surface outside the device region (i.e., in the "field" regions), a suitable magnetic orientation can be achieved for the stack of magnetic films that form the magnetic structure in the device region. In the absence of magnetic material in the field region, the small isolated regions of magnetic material in the device regions may not be able to carry the magnetic field in such a way as to achieve the desired magnetic orientation in the magnetic films that are formed in the device region. On the other hand, the magnetic material in the field region provides a larger continuous area of magnetic material that carries the magnetic field in such a way as to achieve a uniform field strength over the wafer.

When repeating the electroplating processes for each magnetic layer, an electrical contact will be made to the underlying first seed layer 504 at the peripheral edge (rim) of the wafer substrate 502 to form each plated layer of magnetic material in the device region 509. In the other regions (i.e., field region) outside the device region 509, the magnetic layers can be formed during the electroplating process by making contact to the last formed (top most) seed layer.

After formation of the magnetic stack structure in the device region 509 is complete, those portions of the magnetic films and seed layers in the field region (outside the device region 509) can be subsequently removed using known techniques. Moreover, the photoresist layers 506 and 508 can be removed using known techniques. Thereafter, further processing steps can be performed to build integrated circuit devices using the magnetic stack structure. For instance, as noted above, the exemplary process of FIGS. 5A-5F can be used to build lower stack portions of the magnetic structures 120 and 130 of the magnetic device 100 shown in FIG. 1 on the substrate. Thereafter, an insulating layer can be formed over the lower stack portions, following by formation of the conductive coil 110, and then the upper stack portions of the magnetic structures 120 and 130 can be formed over the coil 110 using the same processing steps of FIGS. 5A-5F. When building the magnetic stacks, the same or similar processing steps can be used to form magnetic stacks with shorting along one edge of the stack (e.g., FIG. 3) or shorting along two opposing edges of the magnetic stack (e.g., FIG. 4).

In other embodiments, the first photoresist layer 506 in FIGS. 5A-5F can be replaced by a permanent insulating layer (e.g., oxide layer) that is not removed, but remains as part of the structure. For instance, an oxide layer can be blanket deposited (instead of the first photoresist layer 506) over the first seed layer 504 and then etched to form the opening that defines the device region 509 using a damascene process. Thereafter, a layer of photoresist can be deposited and patterned to form the photoresist layer 508 with the overhang structure 508A using known techniques. With this approach, the permanent insulating layer is not removed, but remains as part of the device structure to facilitate planarization of the magnetic structure, as is understood by those of ordinary skill in the art.

Figure 6C:
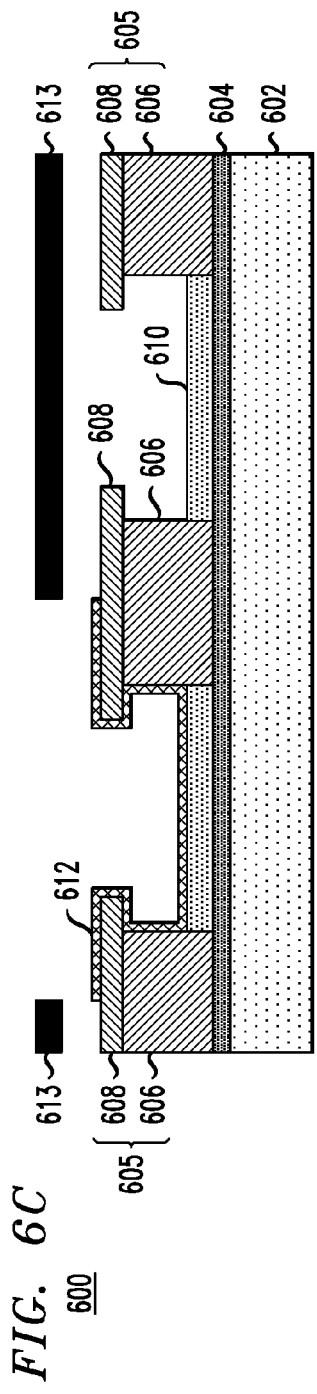
Figure 6D:
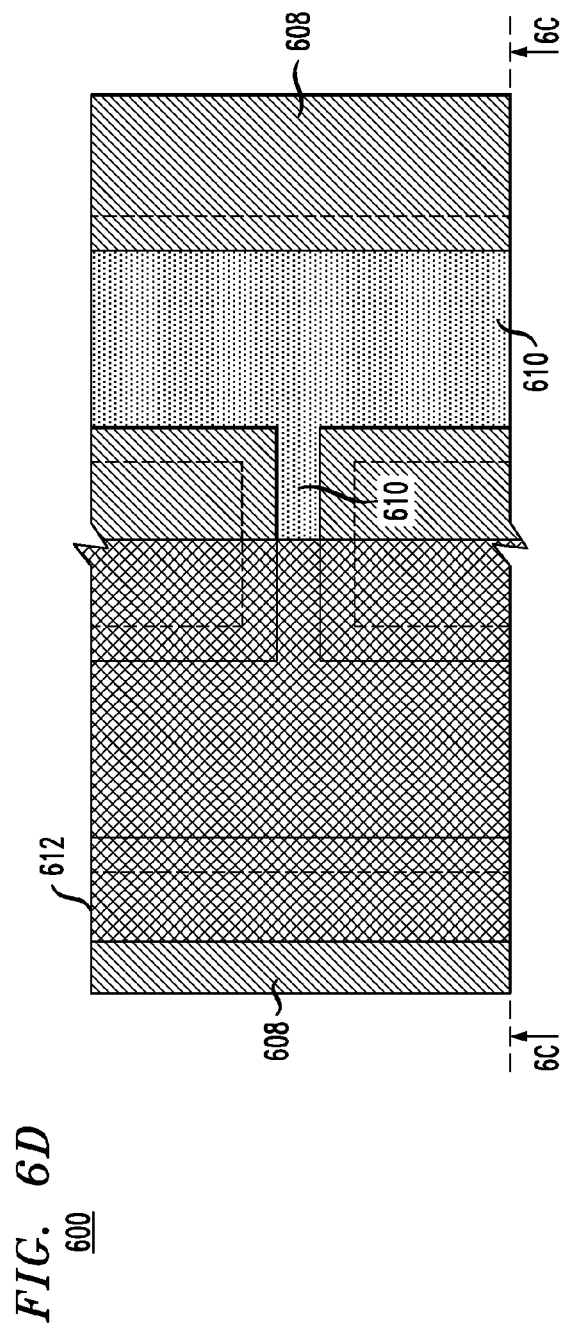

FIGS. 6A, 6B, 6C, 6D, 6E, and 6F schematically illustrate a method for constructing a magnetic structure with local shorting of magnetic layers, according to another exemplary embodiment of the invention. In particular, FIGS. 6A, 6B, 6C, 6D, 6E, and 6F schematically illustrate a process for constructing a magnetic structure, such as shown in FIG. 2, having shorting tabs to provide local shorting of magnetic layers. FIGS. 6A-6F are cross-sectional views of a magnetic structure 600 at various stages of fabrication. FIG. 6A is a cross-sectional view of the magnetic structure 600 at an initial stage of fabrication wherein a first magnetic layer 610 is plated on seed layer 604 formed over a semiconductor substrate 602, wherein the magnetic layer 610 is defined by a mask structure 605. FIG. 6B is a top schematic view of the magnetic structure 600 of FIG. 6A, and FIG. 6A is a cross sectional view of the structure 600 taken along line 6A-6A in FIG. 6B.

As shown in FIGS. 6A and 6B, the first magnetic layer 610 is a continuous layer that is formed in a device region, a tab region, and a field region. For purposes of illustration, the device region can represent the region in which the magnetic stack structure 120 in FIG. 2 is foamed, the tab region can represent the region in which the shorting tab 230 in FIG. 2 is formed, and the field region generically represents a magnetic stack pattern that is formed over the wafer substrate outside the device region. As discussed above, the presence of the magnetic material 610 in the field region provides a larger continuous area of magnetic material that carries a magnetic field in such a way as to enable a more uniform field strength over the wafer and, thus, impart a desired magnetic orientation in the magnetic films in the device region to form the "easy axis." The top schematic view of FIG. 6B shows a portion of the field region, but it is to be understood that the field region can be a rectangular pattern of magnetic material that surrounds the device region and covers a substantial portion of the wafer area outside the device region. As explained below, after formation of the magnetic device, the magnetic layers in the field region are removed.

It is to be understood that the various structures (e.g., photoresists mask structure 605) and material layers (substrate 602, seed 604 and magnetic layer 610) can be formed using the same or similar methods and materials as discussed above with reference to FIG. 5A. The seed layer 604 shown in FIG. 6A is used as an electrode (e.g., cathode) in an electroplating process to form the first magnetic layer 610 that is continuously formed in the device, tab and field regions. The dotted lines in FIG. 6B represent the sidewall edges (in phantom) of the first photoresist layer 606 underlying the second photoresist layer 608.

After forming the first magnetic layer 610, a first layer of insulating material is conformally deposited over the structure of FIGS. 6A/6B to cover portions of the first magnetic layer 610 and mask structure 605 in the device and tab regions. For example, FIG. 6C is a cross-sectional view of the structure of FIG. 6A after forming a conformal insulating layer 612 (or first insulating layer) over the substrate lining portions of the mask structure 605 and the first magnetic layer 610 in the device and tab regions. As shown in FIG. 6C, the first insulating layer 612 is formed using a shadow mask 213 that covers the field region and a portion of the tab region to prevent the insulating material from being deposited in those regions. As more clearly shown in FIG. 6D, which is a top schematic view of the structure 600 shown in FIG. 6C, the first insulating layer 612 is formed to cover the entire portion of the first magnetic layer 610 in the device region, and to cover a portion of the first magnetic layer 610 in the tab region. The first insulating layer 612 serves to isolate the first magnetic layer 610 from a second layer of magnetic material to be subsequently formed on a second conformal seed layer. However, in the tab and field regions, the first insulating layer 612 (and subsequently formed insulating layers) are not formed in a portion of the tab region or in the field region, as the seed layers and magnetic layers formed in the tab and field regions provide the electrical shorting needed to plate the magnetic layers in the device region, as will be explained in further detail below. The first conformal insulating layer 612 may be formed with any suitable insulating materials (e.g. oxide) and deposition methods (e.g., CVD) as discussed above with reference to FIG. 5B.

Figure 6E:
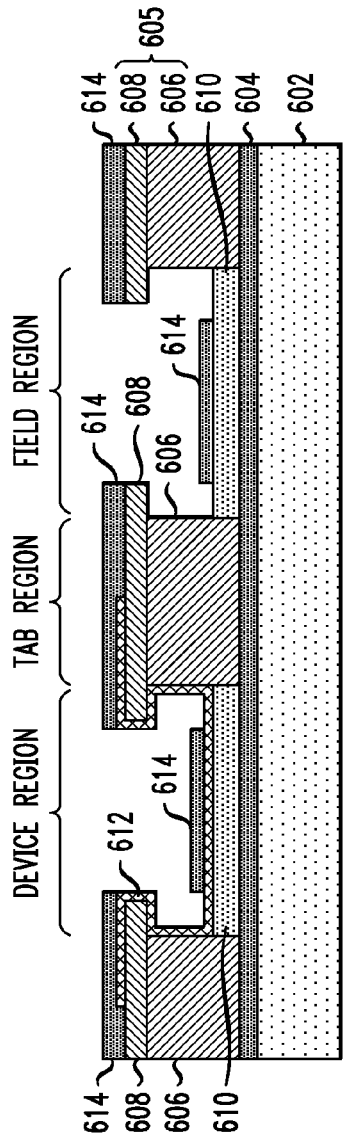

A next step in the exemplary process involves forming a seed layer over the structure of FIGS. 6C/6D. For example, FIG. 6E is a cross sectional view of the structure of FIG. 6C after forming a second seed layer 614. As shown in FIG. 6E, the second seed layer 614 is formed covering the horizontal surfaces of the mask structure 605 and horizontal portions of the insulating layer 612 in the device region. Moreover, the second seed layer 614 is directly formed on portions of the first magnetic layer 610 in the tab and field regions. The second seed layer 614 on the first magnetic layer 610 forms a continuous layer of seed material in the device, tab, and field regions. The second seed layer 614 can be formed using the same or similar materials and deposition processes discussed above with reference to FIG. 5C, except that the seed layer is not deposited on an angle.

In contrast to the "edge" shorting process discussed above with reference to FIGS. 5A-5F, no opening is formed in the first insulating layer 612 in the device region and no conductive plug is formed to connect the second seed layer 614 to the underlying first magnetic layer 610 in the device region. Instead, since the second seed layer 614 formed on the first magnetic layer 610 is a continuous layer in the device, tab and field regions, the portion of the seed layer 614 in the device region is electrically connected to the underlying first seed layer 604 through portions of the first magnetic layer 610 in the tab and field regions to facilitate electroplating of a second magnetic layer in the device region.

Figure 6F:
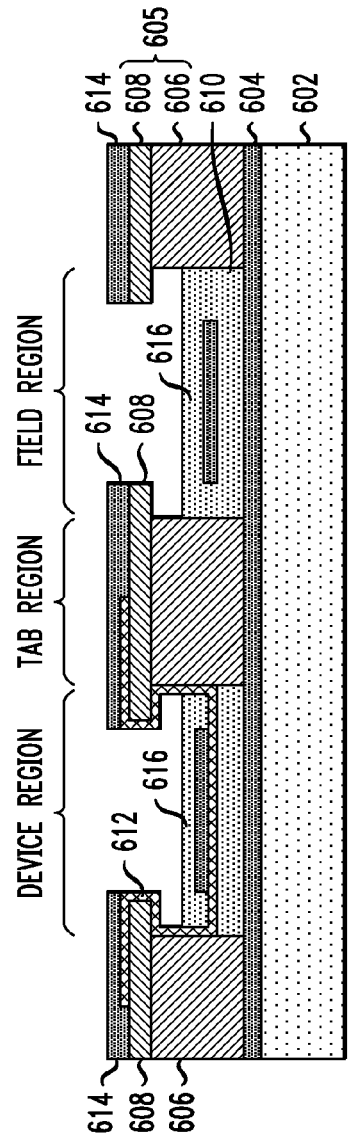

In particular, FIG. 6F is a cross sectional view of the structure of FIG. 6E after forming a second magnetic layer 616 using an electroplating process. In this process, the portion of the second seed layer 614 formed within the device region is electrically connected to the underlying first seed layer 604 through portions of the first magnetic layer 610 in the tab and field regions. As such, despite the first insulating layer 612 fully covering the underlying first magnetic layer 610 in the device regions, the electroplating process can be performed to plate the second layer of magnetic material 616 in the device region by making electrical contact to the underlying first seed layer 604 at the edge of the wafer substrate 602. The second magnetic layer 616 may be formed using any suitable material as discussed above for the first magnetic layer 610.

After forming the second magnetic layer 616, the process steps discussed with reference to FIGS. 6C, 6E and 6F can be repeated to form another insulting layer, seed layer, and magnetic layer over the second magnetic layer 616. In particular, the process steps discussed above with reference to FIG. 6C can be used to form a second conformal insulating layer over the substrate lining the mask structure 605 and the second magnetic layer 616. The process steps discussed above with reference to FIG. 6E can be repeated to form a continuous third seed layer in the device, tab and field regions. Then, the process steps discussed above with reference to FIG. 6F can be repeated to form in a third magnetic layer on the third seed layer by making electrical contact to the first seed layer at the edge (rim) of the wafer substrate. Thereafter, the same sequence of process can be repeated one or more times, as desired, to form one or more additional insulating and magnetic layers of the magnetic stack structure within the device region.

In contrast to previous embodiments discussed above, as shown in FIGS. 6E and 6F, the magnetic layers are not plated on the seed layers (e.g., layer 614) formed on the top of the mask structure 605. Indeed, no plating on top of the mask structure 605 is needed in embodiments where the field region is sufficiently large to uniformly distribute the magnetic field (of the electroplating magnet) over the wafer and, thus, impart a desired magnetic orientation in the magnetic films in the device region to form the "easy axis."

After formation of the magnetic stack structure in the device region is complete, those portions of the magnetic films and seed layers in the tab and field regions can be subsequently removed using known techniques. Moreover, the photoresist layers 606 and 608 can be removed using known techniques. Thereafter, further processing steps can be performed to build integrated circuit devices using the magnetic stack structure. For instance, as noted above, the exemplary process of FIGS. 6A-6F can be used to build lower stack portions of the magnetic structures 120 and 130 of the magnetic device 200 (shown in FIG. 2) on the substrate. Thereafter, an insulating layer can be formed over the lower stack portions, followed by formation of the conductive coil 110, and then the upper stack portions of the magnetic structures 120 and 130 can be formed over the coil 110 using the same processing steps of FIGS. 6A~6F. In the structure 200 shown in FIG. 2, those portions of the shorting tabs 210, 220 and 230 having insulating material between the magnetic layers (see, FIG. 6D) can remain with the final structure for the purpose of, e.g., avoiding inadvertent etching of the magnetic stack structures 120 and 130 at the edges thereof due to etching tolerances, if one were to try to completely etch away the shorting tabs 210, 220, and 230.

It is to be understood that the invention is not limited to the particular materials, features, and structures specifically shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. However, one of ordinary skill in the art will readily recognize those features omitted from these generalized descriptions.

Further aspects of the present invention provide for use of semiconductor inductor and transformer devices in integrated circuits with various analog and digital circuitry. In particular, integrated circuit dies can be fabricated having semiconductor inductor and transformer devices and other semiconductor devices such as a field-effect transistors, bipolar transistors, metal-oxide-semiconductor transistors, diodes, resistors, capacitors, inductors, etc., forming analog and/or digital circuits. The semiconductor inductor and transformer devices can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. An integrated laminated magnetic device, comprising:
   a multilayer stack structure comprising alternating magnetic and insulating layers formed on a substrate, wherein each magnetic layer in the multilayer stack structure is separated from another magnetic layer in the multilayer stack structure by an insulating layer; and
   a local shorting structure to electrically connect each magnetic layer in the multilayer stack structure to an underlying magnetic layer in the multilayer stack structure, wherein the local shorting structure comprises a plurality of conductive plugs disposed in via holes formed in the insulating layers along one edge of the multilayer stack structure, wherein each conductive plug is disposed in a via hole of a given insulating layer between two magnetic layers separated by the given insulating layer.

2. The device of claim 1, wherein the local shorting structure provides an electrical connection between two magnetic layers such that no closed electrical path exists between the two magnetic layers except in a direction parallel to a flux path of the multilayer stack structure.

3. The device of claim 1, wherein the multilayer stack structure comprises a plurality of seed layers, wherein a given seed layer is interposed between a given insulating layer and a given magnetic layer overlaying the given insulating layer.

4. The device of claim 3, wherein the plurality of seed layers comprises a first seed layer interposed between the substrate and a first magnetic layer in the multilayer stack structure, wherein the first seed layer serves as a cathode or anode to form each magnetic layer in the multilayer stack by electroplating using the local shorting structure to connect the first seed layer to other seed and magnetic layers.

5. An integrated circuit chip, comprising an integrated laminated magnetic device as recited in claim 1.

6. An integrated laminated magnetic device, comprising:
   a multilayer stack structure comprising alternating magnetic and insulating layers formed on a substrate, wherein each magnetic layer in the multilayer stack structure is separated from another magnetic layer in the multilayer stack structure by an insulating layer; and
   a local shorting structure to electrically connect each magnetic layer in the multilayer stack structure to an underlying magnetic layer in the multilayer stack structure, wherein the local shorting structure comprises a plurality of conductive plugs disposed in via hoes formed in the insulating layers along a first edge and an opposing second edge of the multilayer stack structure, wherein each conductive plug is disposed in a via hole of a given insulating layer between two magnetic layers separated by the given insulating layer.

* * * * *